(12) United States Patent
Dai

(10) Patent No.: US 8,519,288 B2
(45) Date of Patent: Aug. 27, 2013

(54) KEYPAD ASSEMBLY AND ELECTRONIC DEVICE USING THE SAME

(75) Inventor: Bin Dai, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 328 days.

(21) Appl. No.: 12/913,016

(22) Filed: Oct. 27, 2010

(65) Prior Publication Data

US 2012/0061218 A1 Mar. 15, 2012

(30) Foreign Application Priority Data

Sep. 10, 2010 (CN) .......................... 2010 1 0278412

(51) Int. Cl.
*H01H 3/00* (2006.01)
*H01H 13/00* (2006.01)
(52) U.S. Cl.
USPC .......................................... 200/329; 200/344

(58) Field of Classification Search
USPC .................................. 200/329, 344, 341, 343
See application file for complete search history.

(56) References Cited

U.S. PATENT DOCUMENTS 5,901,837 A * 5/1999 Aimi .............................. 200/344
2010/0089736 A1 * 4/2010 Tsai et al. ...................... 200/5 A

* cited by examiner

*Primary Examiner* — R S Luebke
*Assistant Examiner* — Lheiren Mae Caroc
(74) *Attorney, Agent, or Firm* — Altis Law Group, Inc.

(57) ABSTRACT

A keypad assembly includes a support member, a key switch, a rotation member, and a resilient member. The key switch is located on the support member and includes a triggering portion. The keycap is located opposite to the triggering portion. The rotation member is rotatably connected to the keycap. The resilient member includes first resilient hooks latching with the rotation member. The rotation member is rotated relative to the resilient member at an angle when the key switch is not triggered, such that the first resilient hook elastically deforms and provides an elastic torque to the rotation member.

13 Claims, 3 Drawing Sheets

KEYPAD ASSEMBLY AND ELECTRONIC DEVICE USING THE SAME

CROSS-REFERENCE TO RELATED APPLICATIONS

This application is related to four co-pending U.S. patent application Ser. Nos. 12/913,006, 12/915,277, 12/915,280, 12/915,284, all entitled "KEYPAD ASSEMBLY AND ELECTRONIC DEVICE USING THE SAME", by Bin Dai. Such applications have the same assignee as the instant application and are concurrently filed herewith. The disclosure of the above-identified applications is incorporated herein by reference.

BACKGROUND

1. Technical Field

The present disclosure relates to data input assemblies, and particularly, to a keypad assembly used in an electronic device.

2. Description of the Related Art

Electronic devices often provide a keypad on a panel thereof, allowing control input for a power source or other component by the user.

A keypad assembly is located on a housing of an electronic device. The housing defines a mounting port in a rear surface of the housing. The keypad assembly includes a keycap and a key switch. The keycap is received in the mounting port, and includes a protrusion arranged at a bottom of the keycap. The key switch includes a triggering portion and a contact point. The triggering portion is a convex resilient sheet. The protrusion resists a top of the triggering portion. When the keycap is depressed, the triggering portion is elastically deformed and electrically connected to the contact point. When the keycap is released, the triggering portion returns to its relaxed state. However, clearance occurs between the protrusion and the triggering portion, due to manufacturing tolerance or assembly error. The keycap sides in the mounting port without any resistance because of the clearance, such that contact response of the keypad assembly is lowered.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

Figure 1:
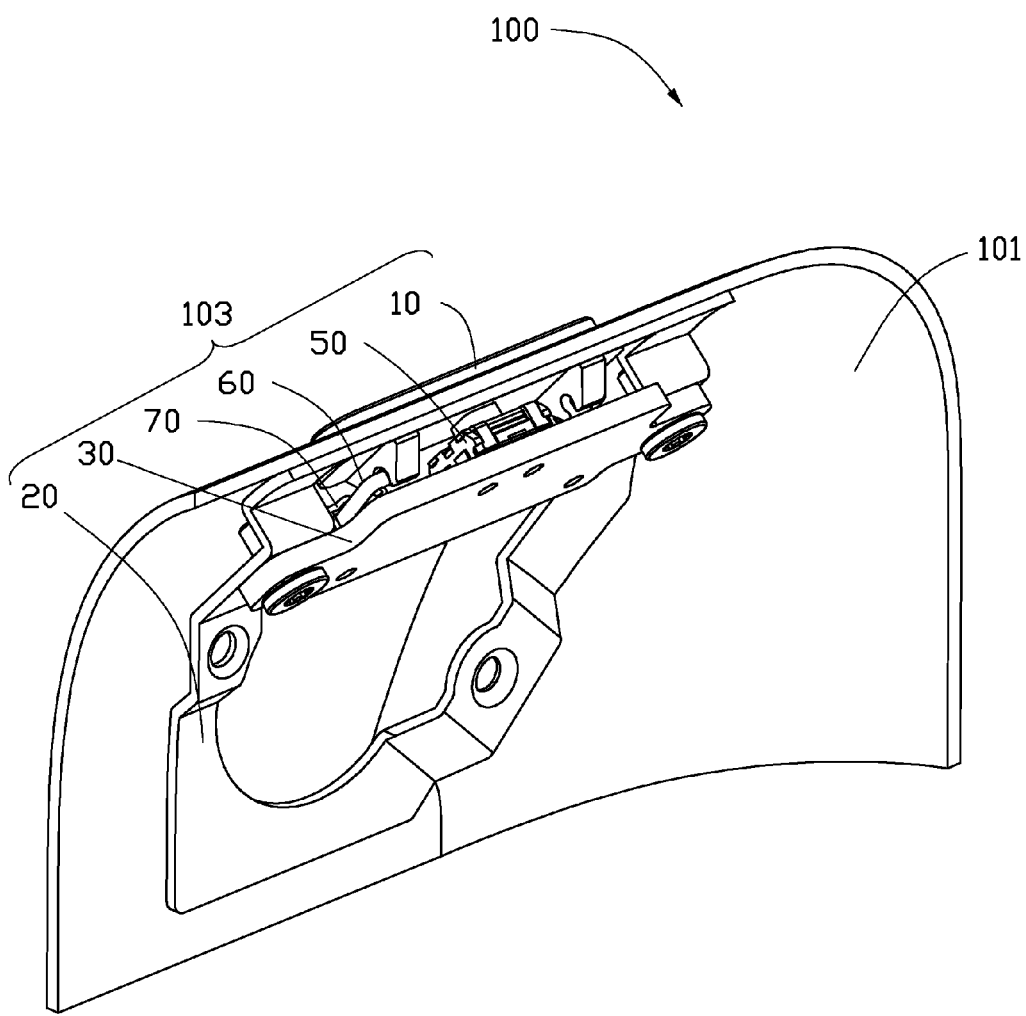
FIG. 1 is a partial, assembled, isometric view of one embodiment of an electronic device including a housing and a keypad assembly mounting on the housing.
Figure 2:
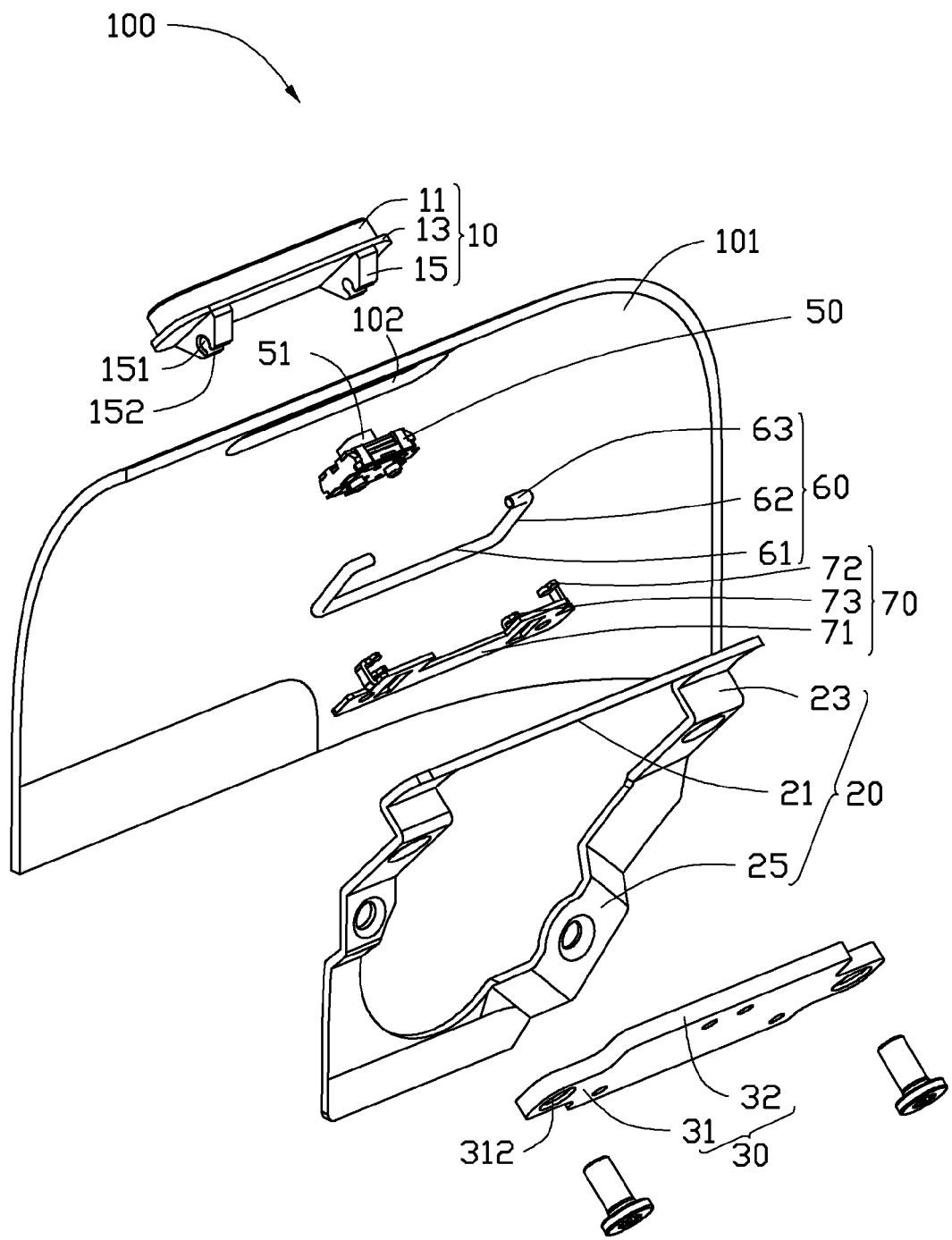
FIG. 2 is an exploded, isometric view of the electronic device shown in FIG. 1.

Referring to FIGS. 1 and 2, an embodiment of an electronic device 100 includes a housing 101 and a keypad assembly 103 located on the housing 101. In the illustrated embodiment, the keypad assembly 103 is a menu button and the housing 101 is an outer case of the electronic device 100. The housing 101 defines a mounting port 102 in the housing 101. In the illustrated embodiment, the mounting port 102 is a through hole.

The keypad assembly 103 includes a keycap 10, a fixing bracket 20, a support member 30, a key switch 50, a rotation member 60, and a resilient member 70. The keycap 10 is partially received in the mounting port 102. The fixing bracket 20 is fixed on an inner surface of the housing 101 adjacent to the mounting port 102. The support member 30 is fixed to the fixing bracket 20, and located opposite to the mounting port 102. The key switch 50 is fixed on the support member 30. The rotation member 60 is rotatably interconnecting the keycap 10 and the resilient member 70. The resilient member 70 is fixed on the support member 30.

The keycap 10 includes a contact portion 11, a limiting portion 13 and two connecting portions 15. The contact portion 11 is substantially oblong and slidably received in the mounting port 102. The limiting portion 13 is arranged at a side of the contact portion 11. The limiting portion 13 is larger than the mounting port 102, such that contact portion 11 is retained within the mounting port 102. The two connecting portions 15 are located at opposite ends of an outer surface of the limiting portion 13. In the illustrated embodiment, each connecting portion 15 defines an pivotal hole 151 in the center of the corresponding connecting portion 15 and a gap 152 communicating with the pivotal hole 151.

The fixing bracket 20 includes a first fixing portion 21, two second fixing portions 23, and a third fixing portion 25. The first fixing portion 21 is substantially rectangular and fixed in an inner side of the housing 101. The two second fixing portions 23 extend from opposite ends of the first fixing portion 21 and are fixed to opposite ends of the third fixing portion 25. The first fixing portion 21, the second fixing portions 23, and the third fixing portion 25 cooperatively form a substantially closed bracket. In this embodiment, the first fixing portion 21 is fixed on an inner side of the housing 101 by welding. The third fixing portion 25 is used to fix other components (not shown) of the electronic device 100.

The support member 30 includes a main body 31 and a support portion 32 located at the center of a side of the main body 31. The main body 31 defines two through holes 312 in opposite ends of the main body 31. The main body 31 is fixed on the second fixing portion 23 of the fixing bracket 20 via threaded members (not shown) received in the through holes 312.

The key switch 50 is fixed on the support portion 32 of the support member 30, and includes a triggering portion 51. The limiting portion 13 of the keycap 10 contacts the triggering portion 51 to trigger the key switch 50. In this embodiment, the key switch 50 is fixed on the support member 30 by welding.

The rotation member 60 is an open loop structure, and includes a first loop portion 61, two second loop portions 62 and two ends 63. The two second loop portions 62 extend from opposite ends of the first loop portion 61 perpendicular to the first loop portion 61, such that the first loop portion 61 and the two second loop portions 62 cooperatively form a U shape. The two ends 63 extend from an end of the two second loop portions 62 away from the first loop portion 61, and are parallel to the first loop portion 61. In the illustrated embodiment, the rotation member 60 is made from a steel wire.

The resilient member 70 includes a fixing portion 71, two first resilient hooks 72, and two second resilient hooks 73 arranged on the fixing portion 71. In the illustrated embodiment, the fixing portion 71 is integrally formed with the two first resilient hooks 72 and the two second resilient hooks 73, and made of an elastic material.

Figure 3:
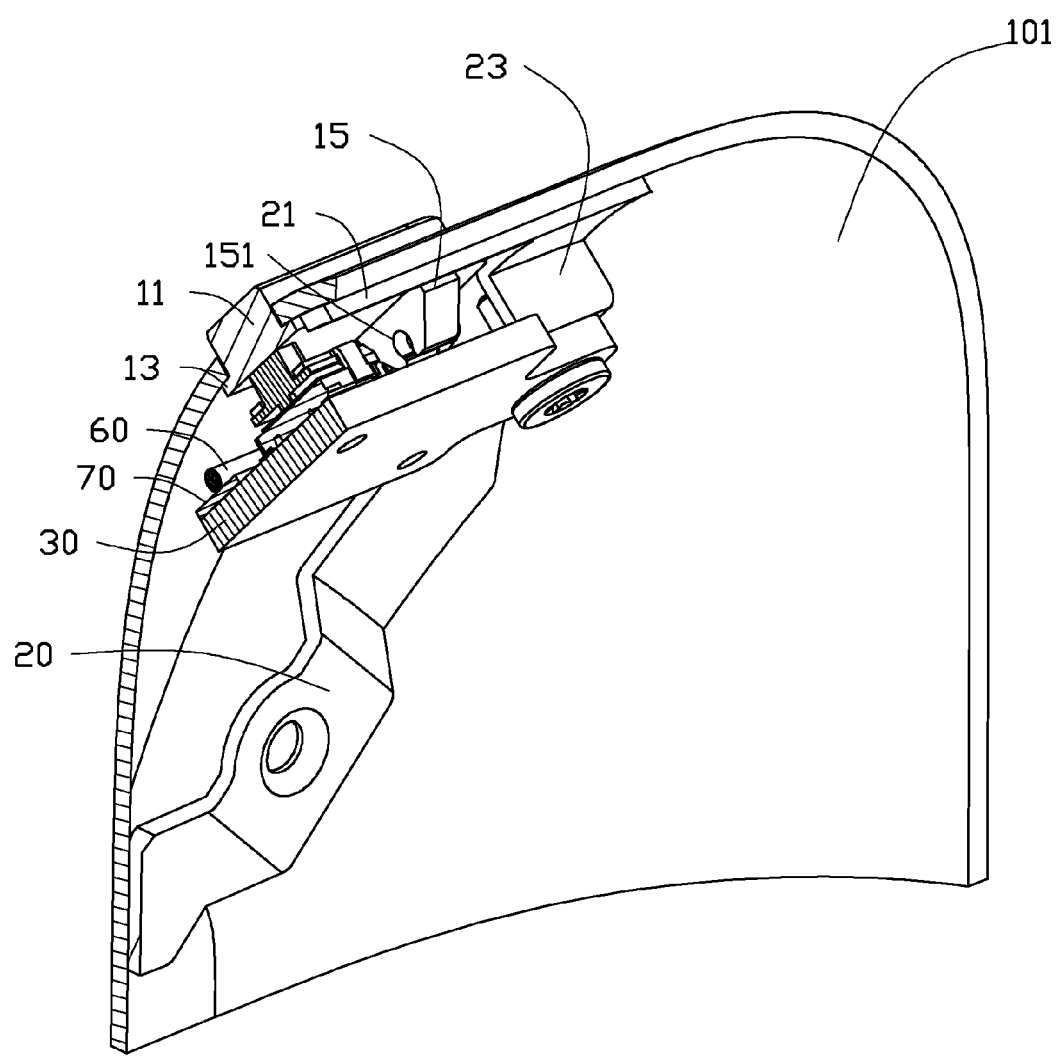
FIG. 3 is a partial cut away isometric view of the electronic device shown in FIG. 1.

Referring to FIGS. 2 and 3, during assembly of the keypad assembly 103, the first loop portion 61 of the rotation member 60 is latched in the second resilient hooks 73. The second loop portions 62 of the rotation member 60 are latched with the first resilient hooks 72. The two ends 63 of the rotation member 60 are received in the pivotal holes 151 of the keycap 10 via the gaps 152, such that the rotation member 60 can be rotated relative to the keycap 10. The contact portion 11 of the keycap 10 is received in the mounting port 102 of the housing 101. The first fixing portion 21 of the fixing bracket 20 is fixed on an inner side of the housing 101. The opposite ends of the main body 31 of the support member 30 are connected to the two second fixing portions 23 of the fixing bracket 20. The key switch 50 is fixed on a side of the support member 30. The fixing portion 71 of the resilient member 70 is fixed on the support member 30.

When depressed, the keycap 10 slides toward the triggering portion 51 of the key switch 50 until the key switch 50 is triggered. When the keycap 10 is released, the triggering portion 51 of the key switch 50 returns to a relaxed state and resists the keycap 10. The rotation member 60 rotates relative to the resilient member 70 at an angle, such that the first resilient hooks 72 of the resilient member 70 elastically deform and provide an elastic torque to the rotation member 60. Thus, the limiting portion 13 of the keycap 10 tightly contacts the triggering portion 51 of the key switch 50, such that the keypad assembly 103 provides acceptable resistance.

It should be pointed out that the elastic torque of the rotation member 60 provided by the first resilient hooks 72 of the resilient member 70 is less than the biasing force provided by the keycap 10, so that the key switch 50 is prevented from triggering inadvertently.

It is to be understood that the fixing bracket 20 can also be omitted, correspondingly, wherein the support member 30 is fixed on an inner side of the housing 101. The second resilient hooks 73 of the resilient member 70 can also be omitted, whereby the first loop portion 61 of the rotation member 60 is rotatably connected to the resilient member 70 by a hinge.

Finally, while the present disclosure has been described with reference to particular embodiments, the description is illustrative of the disclosure and is not to be construed as limiting the disclosure. Therefore, various modifications can be made to the embodiments by those of ordinary skill in the art without departing from the true spirit and scope of the disclosure as defined by the appended claims.

What is claimed is:

1. A keypad assembly comprising:
   a support member;
   a key switch located on the support member and comprising a triggering portion;
   a keycap located opposite to the triggering portion;
   a rotation member rotatably connected to the keycap, and comprising a first loop portion and two second loop portions extending from opposite ends of the first loop portion; and
   a resilient member comprising a first resilient hook and a second resilient hook, the first resilient hook latching with the corresponding second loop potion, the second resilient hook latching with the first loop portion, wherein the rotation member is rotated relative to the resilient member at an angle when the key switch is not triggered, such that the first resilient hook elastically deforms and provides an elastic torque to the rotation member.

2. The keypad assembly of claim 1, wherein the key cap comprises a contact portion, a limiting portion arranged at a side of the contact portion, and two connecting portions located at opposite ends of an outer surface of the limiting portion, wherein the rotation member is rotatably connected to the two connecting portions.

3. The keypad assembly of claim 2, wherein each connecting portion defines a pivotal hole and a gap communicating with the pivotal hole, with opposite ends of the rotation member received in the pivotal holes via the gaps.

4. The keypad assembly of claim 3, wherein the rotation member is an open loop structure.

5. The keypad assembly of claim 1, wherein the support member comprises a main body and a support portion located at the center of a side of the main body, the key switch is fixed on the main body.

6. A keypad assembly comprising:
   a support member;
   a resilient member fixed on the support member;
   a key switch fixed on the support member and comprising a triggering portion;
   a keycap located opposite to the triggering portion; and
   a rotation member rotatably connected to the keycap and the resilient member, wherein the resilient member provides an elastic torque to the rotation member when the key switch is not triggered, the elastic torque forces the keycap to maintain contact with the triggering portion.

7. The keypad assembly of claim 6, wherein the key cap comprises a contact portion, a limiting portion arranged at a side of the contact portion, and two connecting portions located at opposite ends of an outer surface of the limiting portion, and the rotation member is rotatably connected to the two connecting portions.

8. The keypad assembly of claim 7, wherein each connecting portion defines a pivotal hole and a gap communicating with the pivotal hole, and opposite ends of the rotation member are received in the pivotal holes via the gaps.

9. The keypad assembly of claim 8, wherein the rotation member is an open loop structure.

10. The keypad assembly of claim 9, wherein the rotation member comprises a first loop portion and two second loop portions extending from opposite ends of the first loop portion; the resilient member comprises a first resilient hook latched with a corresponding second loop portion.

11. The keypad assembly of claim 10, wherein the resilient member further comprises a second resilient hook latching with the first loop portion.

12. The keypad assembly of claim 6, wherein the support member comprises a main body and a support portion located at the center of a side of the main body; the key switch is fixed on the main body.

13. An electronic device comprising:
   a housing defining a mounting port;
   a keypad assembly located on the housing, the keypad assembly comprising:
   a support member fixed to the housing;
   a key switch located on the support member and comprising a triggering portion;
   a keycap located opposite to the triggering portion and partially received in the mounting port, the keycap comprising a contact portion, a limiting portion arranged at a side of the contact portion, and two connecting portions located at opposite ends of an outer surface of the limiting portion respectively, each connecting portion defining a pivotal hole and a gap communicating with the pivotal hole, and opposite ends of the rotation member received in the pivotal holes via the gaps;
   a rotation member rotatably connected to the keycap, wherein the rotation member is an open loop structure, and is rotatably connected to the two connecting portions, the rotation member comprising a first loop portion and two second loop portions extending from opposite ends of the first loop portion, the first resilient hook latched with the corresponding second loop portion; and a resilient member comprising a first resilient hook and a second resilient hook, the first resilient hook latching with the second loop potions, the second resilient hook latching with the first loop portion, wherein the rotation member is rotated relative to the resilient member at an angle when the key switch is not triggered, such that the first resilient hook elastically deforms and provides an elastic torque to the rotation member.

\* \* \* \* \*